(12) United States Patent
Arsovski et al.

(10) Patent No.: US 7,515,449 B2
(45) Date of Patent: Apr. 7, 2009

(54) CAM ASYNCHRONOUS SEARCH-LINE SWITCHING

(75) Inventors: Igor Arsovski, Williston, VT (US); Rahul K. Nadkarni, Greenville, NC (US); Reid A. Wistort, Westford, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 11/532,233

(22) Filed: Sep. 15, 2006

(65) Prior Publication Data

US 2008/0080223 A1 Apr. 3, 2008

(51) Int. Cl.
*G11C 15/00* (2006.01)

(52) U.S. Cl. .............. 365/49.1; 365/189.07; 365/233.5; 711/117; 370/392

(58) Field of Classification Search ............ 365/49, 365/189.07, 233.5; 711/117; 370/392
See application file for complete search history.

(56) References Cited

U.S. PATENT DOCUMENTS

| | | | | |
|---|---|---|---|---|
| 5,420,993 A | * | 5/1995 | Smith et al. | 711/206 |
| 6,373,738 B1 | | 4/2002 | Towler et al. | 365/49 |
| 6,570,877 B1 | * | 5/2003 | Kloth et al. | 370/392 |
| 6,650,575 B1 | * | 11/2003 | Khanna | 365/194 |
| 6,781,857 B1 | * | 8/2004 | Lien et al. | 365/49.15 |
| 6,856,529 B1 | * | 2/2005 | Radke | 365/49.18 |
| 6,967,856 B1 | * | 11/2005 | Park et al. | 365/49.16 |
| 2001/0033508 A1 | * | 10/2001 | Waller | 365/49 |
| 2005/0219887 A1 | * | 10/2005 | Hsu et al. | 365/49 |
| 2006/0203529 A1 | * | 9/2006 | Radke | 365/49 |

* cited by examiner

*Primary Examiner*—Huan Hoang
*Assistant Examiner*—Fernando N Hidalgo
(74) *Attorney, Agent, or Firm*—Robert Walsh; Michael Lestrange

(57) ABSTRACT

This patent describes a method for switching search-lines in a Content Addressable Memory (CAM) asynchronously to improve CAM speed and reduce CAM noise without affecting its power performance. This is accomplished by resetting the match-lines prior to initiating a search and then applying a search word to the search-lines. A reference match-line is provided to generate the timing for the search operation and provide the timing for the asynchronous application of the search data on the SLs. Additional noise reduction is achieved through the staggering of the search data application on the SLs through programmable delay elements.

16 Claims, 7 Drawing Sheets

CAM ASYNCHRONOUS SEARCH-LINE SWITCHING

BACKGROUND OF THE INVENTION

1. Field of the Invention

This invention relates to operation of Content Addressable Memory (CAM) and particularly to search-line activation for improved performance and reducing noise.

2. Background

Content Addressable Memory (CAM) is an application specific memory designed to accelerate the search of large look-up tables. CAM is commonly used for applications such as address translation in network routers, TLBs, in processor caches, pattern recognition, and data compression. CAM is an attractive solution for these applications because it performs a fully parallel search of the entire look-up table, and, regardless of table size, returns a search result in nanoseconds. FIG. 1 shows a simple CAM architecture that illustrates how this fast search operation is performed. During the search operation the search data in the Search Word Register is supplied to every CAM word via Search-Lines (SLs), compared to every stored word in every entry, and the results of this comparison are displayed on all Match-Lines (MLs). Since both SLs and MLs are highly capacitive and they switch near simultaneously, the CAM search operation not only causes high power consumption but also generates severe on-chip power supply noise in the form of VDD droop and GND bounce. This power-supply noise is especially of concern in Embedded CAM (eCAM), which shares its environment with noise-sensitive circuits. The large supply voltage compression can not only cause failure in the CAM but also affect the neighboring circuits that may be noise-sensitive. Technology scaling further aggravates this problem by decreasing voltage headroom while increasing both current density, which exacerbates the resistive voltage drop, and transition speed, which enlarges Ldi/dt noise.

To reduce CAM induced on-chip noise the switching of the highly capacitive SLs and MLs needs to be spread over a larger time across the cycle, thereby reducing the noise superposition associated with near-simultaneous switching. The conventional search operation first switches the highly capacitive SLs and then activates the ML sensing circuits at the arrival of each active clock. These synchronous switching crowds the SL and ML switching events, superimposing their voltage compression and creating a single large noise event during the search cycle. At the same time the need for faster CAMs is increasing both the peak current demand and reducing the time between the SL and ML switching events.

A need exists, therefore, for an apparatus and method for a low-noise CAM which can improve CAM performance while reducing the voltage compression associated with SL and ML switching A recent development of a new search scheme (precharge-to-GND Match-line sensing scheme is described in U.S. Pat. No. 6,373,738 which is hereby incorporated in its entirety herein) has not only improved power but also enabled new ways of improving sense speed and reducing noise.

SUMMARY OF THE INVENTION

The shortcomings of the prior art are overcome and additional advantages are provided by asynchronous SL switching to improve search access and reduce voltage compression for various CAM applications, such as Embedded CAM (eCAM), or Embedded Ternary CAM (eTCAM) hereinafter will be identified as CAM.

Prior search schemes switch the SLs synchronously at the beginning of each search cycle, evaluating the MLs only after the SLs have completely switched. Since the SLs are highly capacitive, SL switching can take up a significant fraction of the overall cycle time. To reduce the search access time this invention switches its SLs asynchronously as soon as the previous search result is latched and by doing so, eliminates the SL switching portion of the search access.

The proposed scheme also reduces noise by maximizing the time between the SL and ML noise events. In prior search schemes, SL and ML activation is performed consecutively after the arrival of the active clock edge, causing a superposition of the current demand and voltage compression. This voltage compression superposition is partially caused by the inability of the power-supply voltage to recover from the SL noise event by the time of the ML noise event. To address this problem instead of applying the search data on the SLs at the arrival of the active clock edge, the present invention applies the search data on the SLs asynchronously as soon as the previous search results are latched. This type of asynchronous SL switching increases the time between SL and ML noise events and by doing so allows the power-supply voltage to recover by the time of the ML activation, reducing the peak power-supply voltage compression. Further noise reduction can be achieved by staggering the activation of the asynchronous SLs. By placing delay elements between individual SL driver activation circuits or groups of SL driver activation circuits, one embodiment of this invention trades off increased cycle-time for reduced on-chip noise. Both the activation of the delay elements and their delay can be programmed based on the process corner where the chip is implemented, thereby maximizing noise reduction for fast process chips, while minimizing the delay for slow process chips. All of the improvements described in this invention originate by the elimination of the need for SL reset before every search operation—a requirement present in the conventional precharge-to-VDD ML sensing scheme. The detailed explanation of circuit modifications to achieve these improvements is found below.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Turning now to the invention in greater detail, we will discuss the architecture and operation of the CAM and technique to activate the search lines asynchronously.

Figure 1:
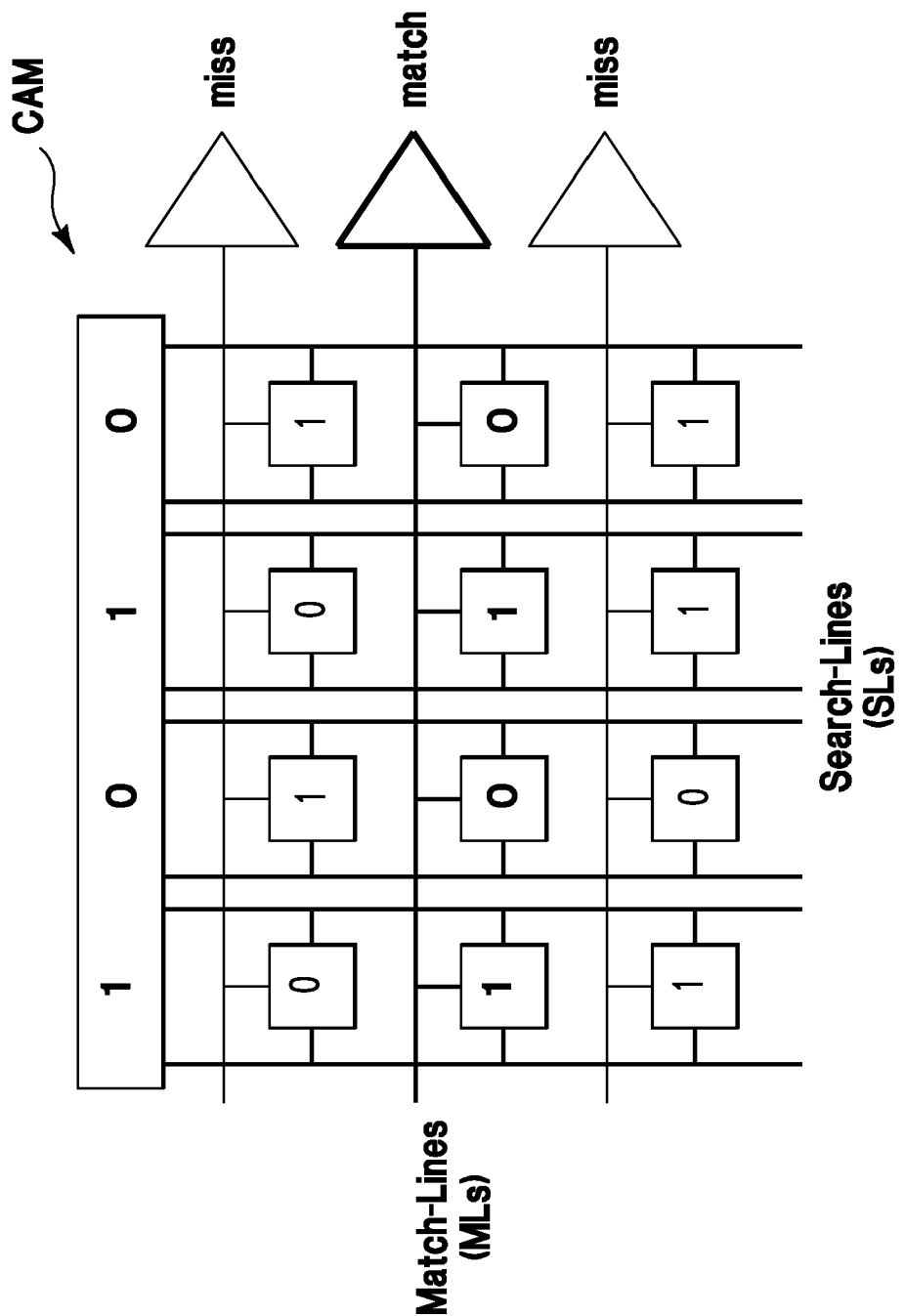
FIG. 1 illustrates an example of a conventional CAM architecture.

Content Addressable Memory (CAM) is an application specific memory designed to accelerate the search of large look-up tables. CAM is commonly used for applications such as address translation in network routers, TLBs in processor caches, pattern recognition, and data compression. CAM is an attractive solution for these applications because it performs a fully parallel search of the entire look-up table, and, regardless of table size, returns a search result within nanoseconds. FIG. 1 shows a simple CAM architecture that illustrates how this fast search operation is performed. During the search operation the search data in the Search Word Register is supplied to every CAM word via Search-Lines (SLs), compared to every stored word in every entry, and the results of this comparison are displayed on all Match-Lines (MLs). SLs and MLs are highly capacitive and therefore SL switching and ML evaluation represent a significant portion of the overall cycle.

Figure 2:
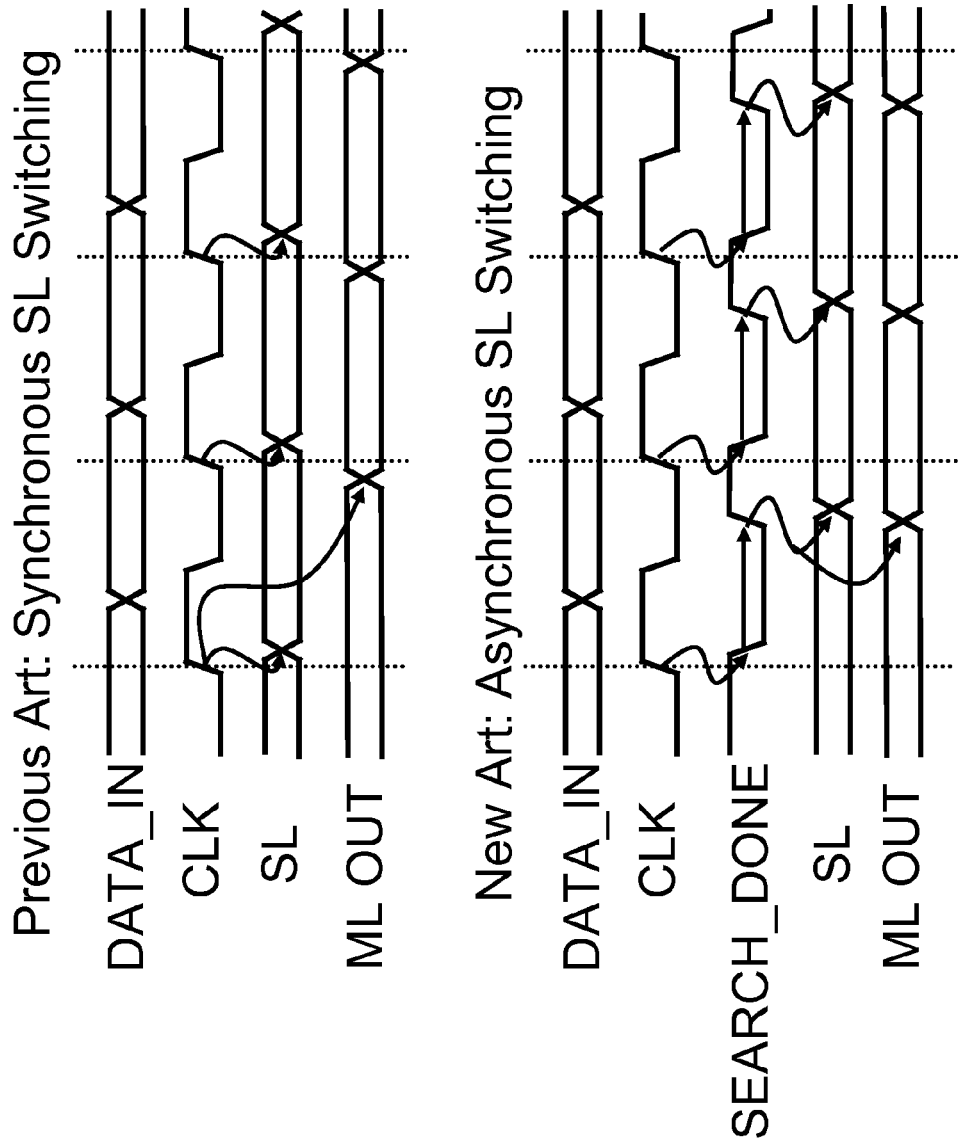
FIG. 2 shows a comparison between the timing waveforms for conventional SL activation to asynchronous SL activation in accordance with the present invention.

FIG. 2 compares the timing waveforms of the conventional synchronous SL switching scheme with the asynchronous switching scheme of the present invention. In the conventional scheme, SLs switch in response to the rising (leading) edge of the CAM clock (CLK) signal. The ML evaluation has to wait until all SLs have completely switched. The ML output signals (MLOUT) become available once the ML evaluation is complete. In the present invention, the ML evaluation does not have to wait for the SLs to switch but can start right after the CLK starts its rising edge. Additionally the signal SEARCH_DONE goes low indicating that the search operation has started. Once the ML evaluation is complete, MLOUTs become available and the SEARCH_DONE goes high indicating that ML evaluation is complete. As soon as SEARCH_DONE goes high and the input data (DATA_IN) for the subsequent cycle is available, the corresponding SLs can switch. This allows the ML evaluation for the subsequent cycle to start right after the subsequent CLK rising edge. In the present invention, the SLs are not directly activated by the CLK but are activated upon completion of the ML evaluation and therefore switch asynchronously from the CLK. This improves the delay from CLK to MLOUT by an amount equal to the delay from CLK to SL.

Figure 3:
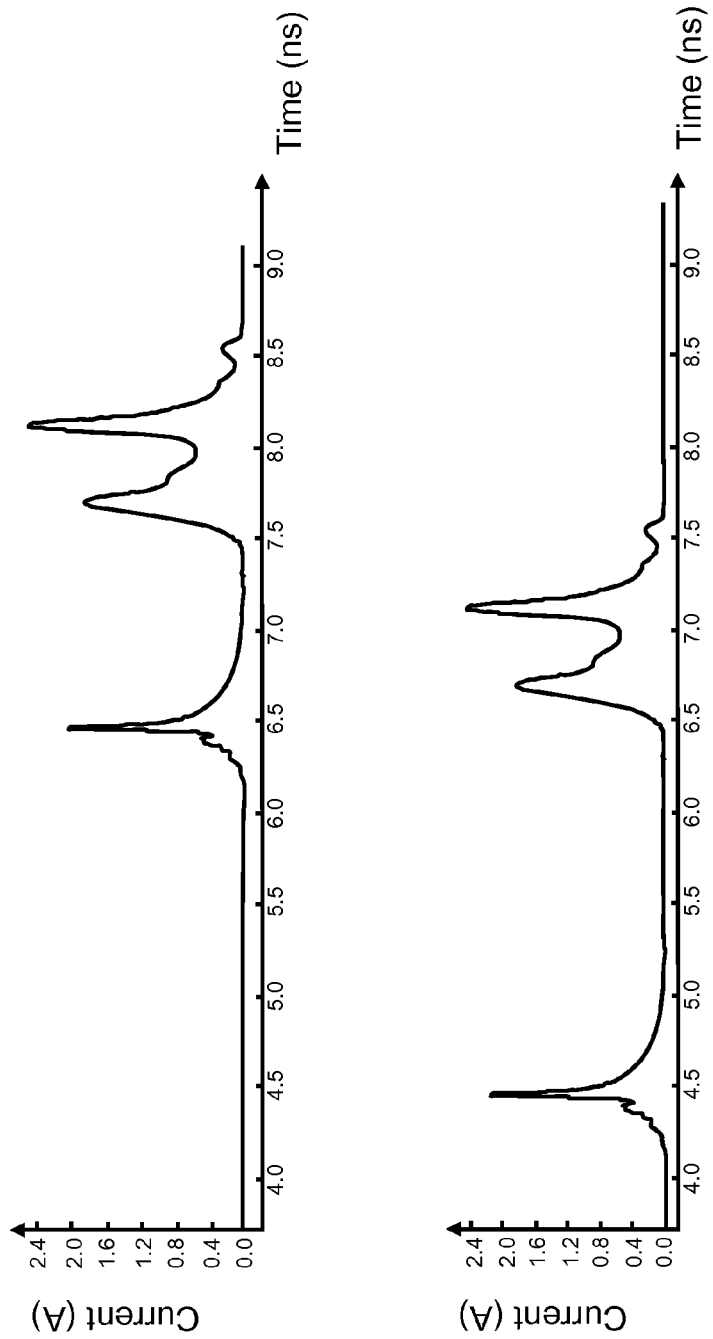
FIG. 3 illustrates current waveforms for conventional SL activation and asynchronous SL activation.

FIG. 3 shows the current waveforms for the conventional SL switching scheme and those for the asynchronous switching of the present invention. Both waveforms show three major peaks corresponding to the first SL switching, followed by the second ML evaluation peak followed by the third MLOUT switching peak respectively. In the conventional SL switching scheme, those three events happen successively right after one another and for every search cycle. In the new scheme, the separation between SL switching and ML evaluation can be controlled. At the fastest CLK frequency, the three peaks will closely line-up for the two SL schemes. At slower frequencies and/or at best-case process corner, the separation between the SL switching and ML evaluation will be significantly more for the asynchronous SL switching scheme than that for the conventional SL switching scheme. More separation allows more spreading of power-supply noise and allows the power-supply to return to its nominal value between subsequent search operations.

Figure 4:
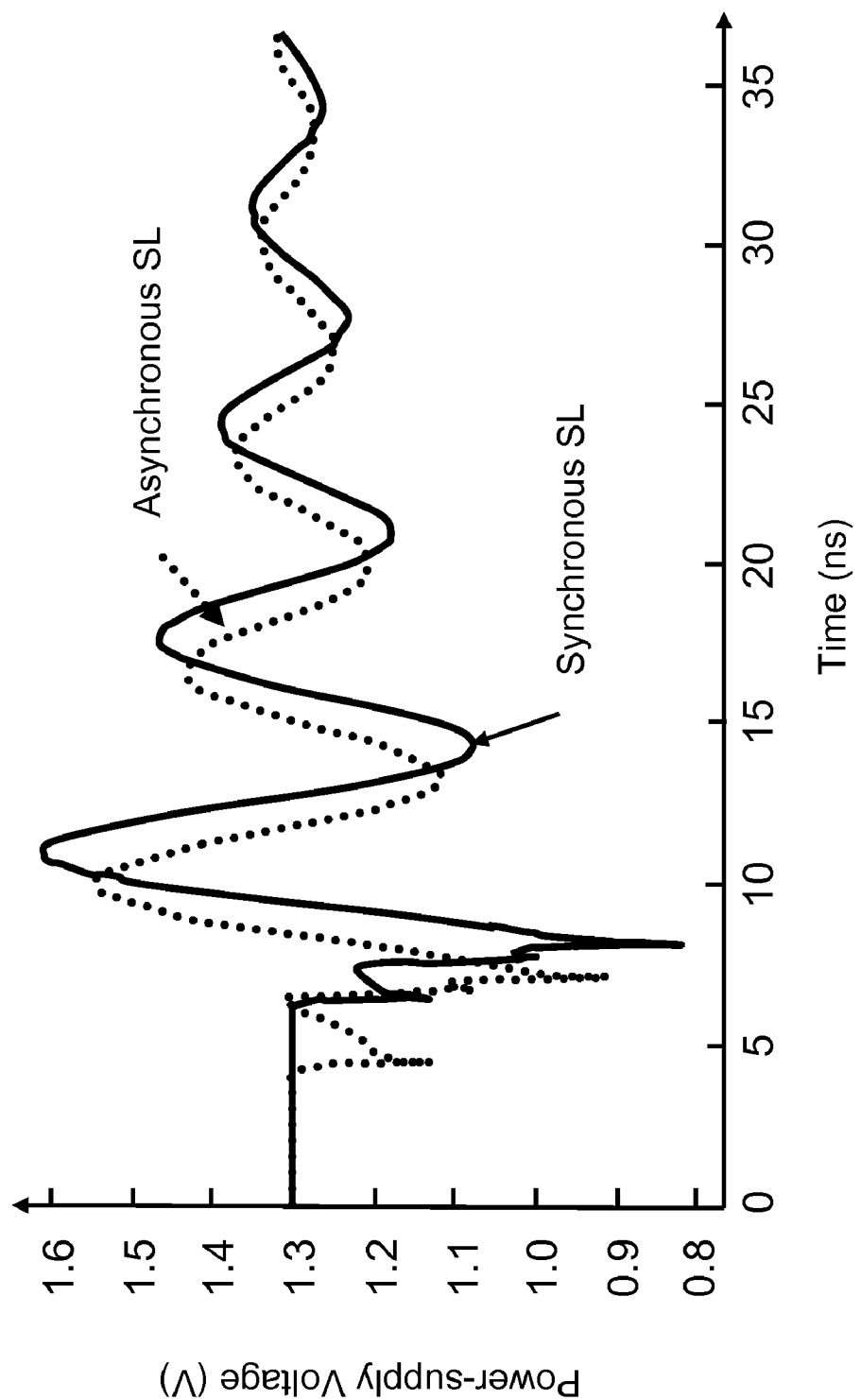
FIG. 4 illustrates the power-supply-noise for conventional SL activation and asynchronous SL activation.

FIG. 4 illustrates the power-supply noise associated with the two SL switching schemes. These waveforms were generated using generic package model (GPM) analysis on the two schemes with identical ceramic ball grid array (CBGA) packages. In the conventional SL switching scheme, the SL switching causes the supply voltage to droop. The supply voltage then starts to recover to its nominal value. But since ML evaluation starts immediately, it does not allow the supply voltage to recover completely and causes the supply voltage to droop even more. Finally the MLOUT switching causes even more droop. The asynchronous SL switching scheme allows more separation between the SL switching and ML evaluation. Therefore the power supply can recover to its nominal value between those two events. As a result, the asynchronous SL switching scheme produces less power-supply noise than the conventional scheme.

Figure 5:
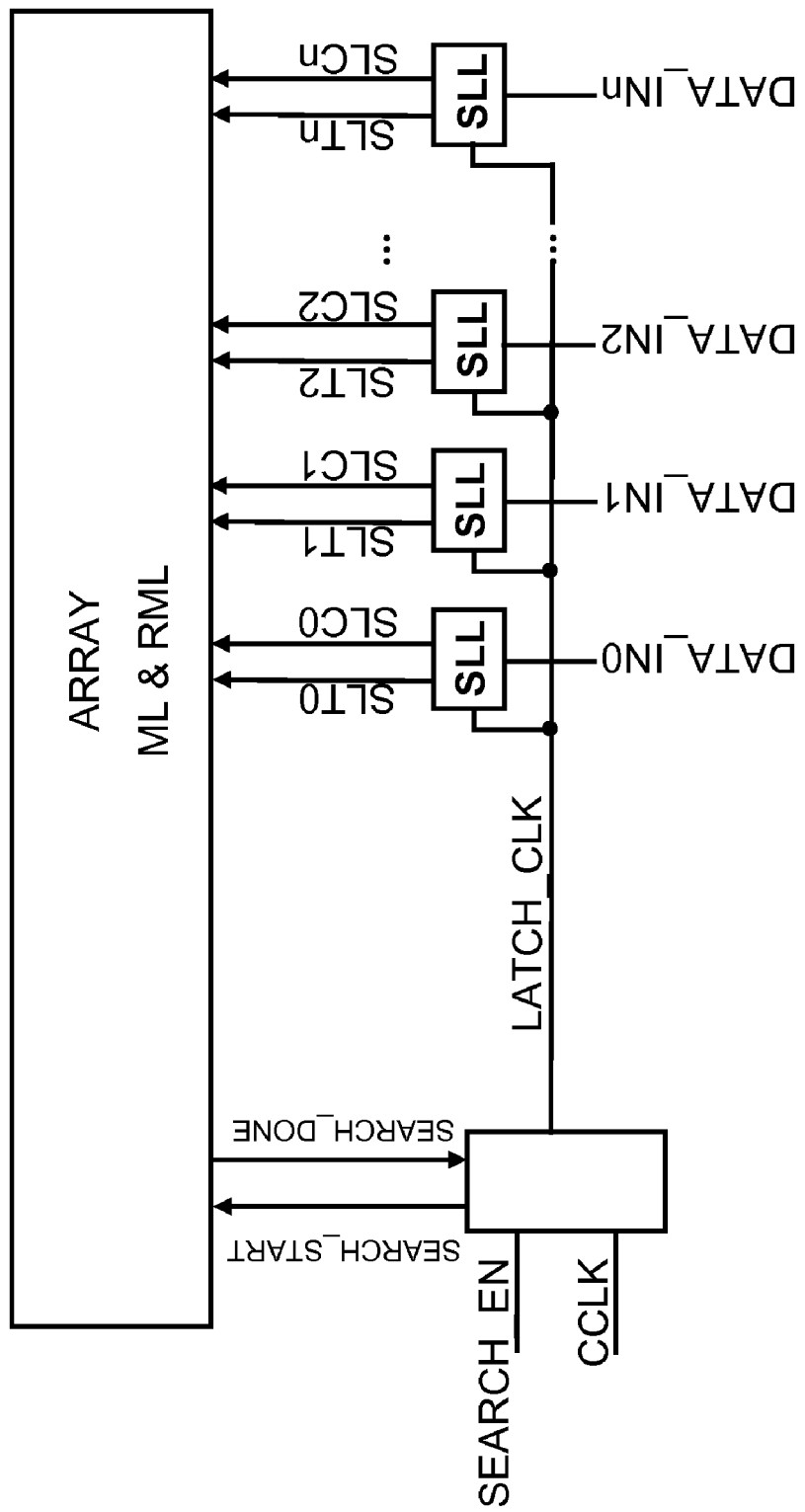
FIG. 5 illustrates a block-level implementation of the asynchronous SL activation in accordance with the present invention.

FIG. 5 shows a block-level implementation of the asynchronous SL switching in accordance with the present invention. The signal SEARCH_DONE is deactivated on the rising (leading) CLK edge and is activated upon completion of ML evaluation. To reduce unnecessary SL switching, SEARCH_DONE is gated with the search operation enable signal SEARCH_EN to enable SL switching only when the subsequent operation is also a search operation. Each input data signal (DATA_INx) goes to a latch and a driver (SLL) which subsequently drives the true and complement SLs (SLTs and SLCs). The application of the new data on the SLs is enabled only after the previous search operation has completed and the reference ML (RML) has generated the signal to latch the previous search results. As soon as the previous search results are captured the latch clock signal (LATCH_CLK) goes high, making the SLL latches transparent and applying the next search data on the SLs. However if the SEARCH_EN signal is low or DATA_IN does not change from one search cycle to the subsequent search cycle, the corresponding SLs will not switch, saving power . . . .

Figure 6:
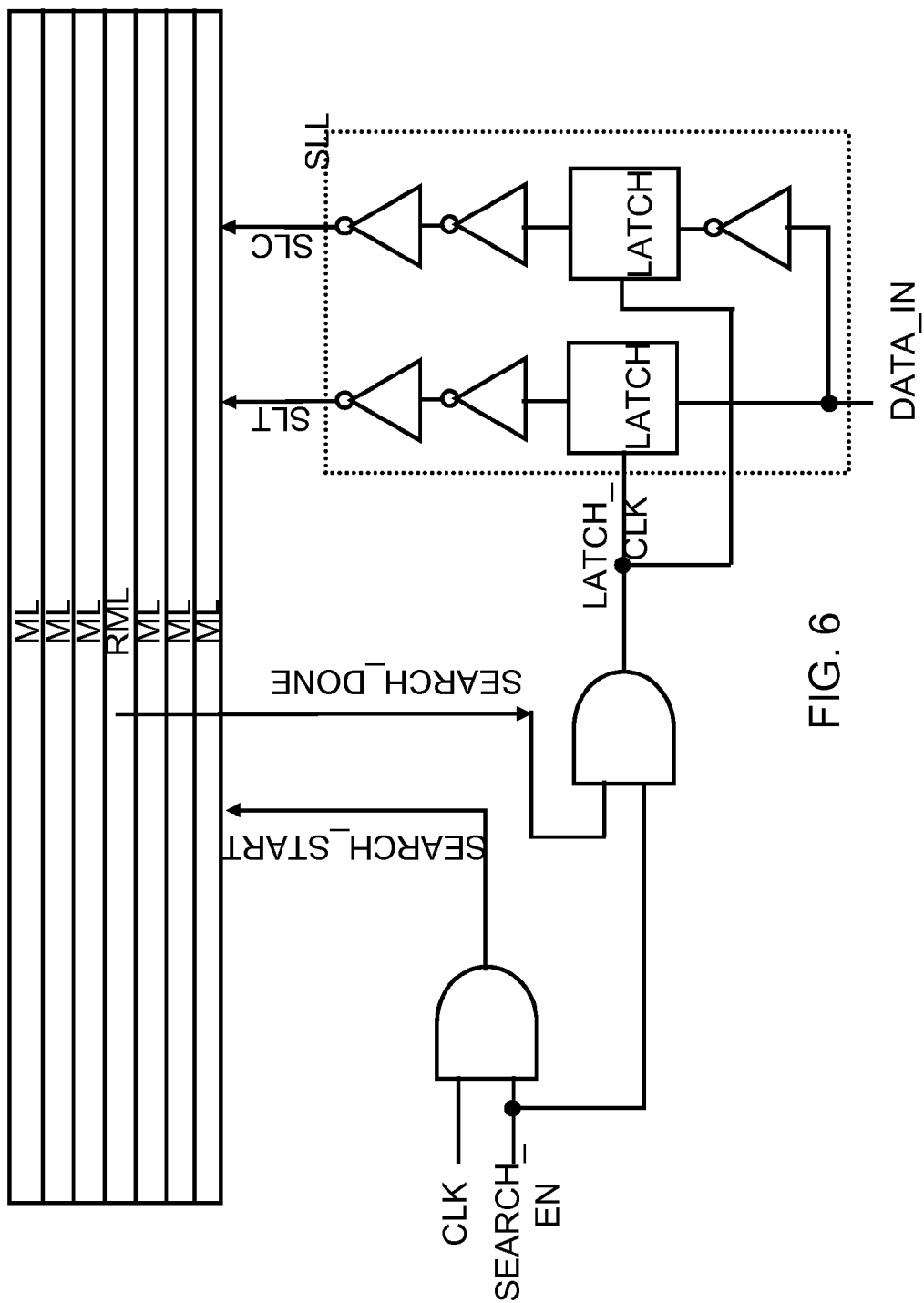
FIG. 6 illustrates a gate-level implementation of the asynchronous SL activation in accordance with the present invention.

FIG. 6 shows a gate-level implementation of the asynchronous SL switching scheme of the present invention. Here CLK and SEARCH_EN are connected to an AND gate. The output of the AND gate (SEARCH_START) follows CLK when SEARCH is '1'. When CLK becomes '1' and SEARCH_EN is '1', SEARCH_START becomes '1' and starts ML evaluation. During the ML evaluation the SLL outputs remain unchanged to ensure valid search results. As soon as the reference ML (RML) signals a completion of the search operation, and the search results are latched, the SEARCH_DONE becomes '1'. SEARCH_DONE and SEARCH_EN are connected to an AND gate and the output of the AND gate (LATCH_CLK) serves as the clock signal for the SLL latch. SLL is comprised of two latches—one corresponding to SLT and the other corresponding to SLC. DATA_IN is directly fed into one latch and inverted and fed to the other latch. This drives complementary values on SLT and SLC.

Figure 7:
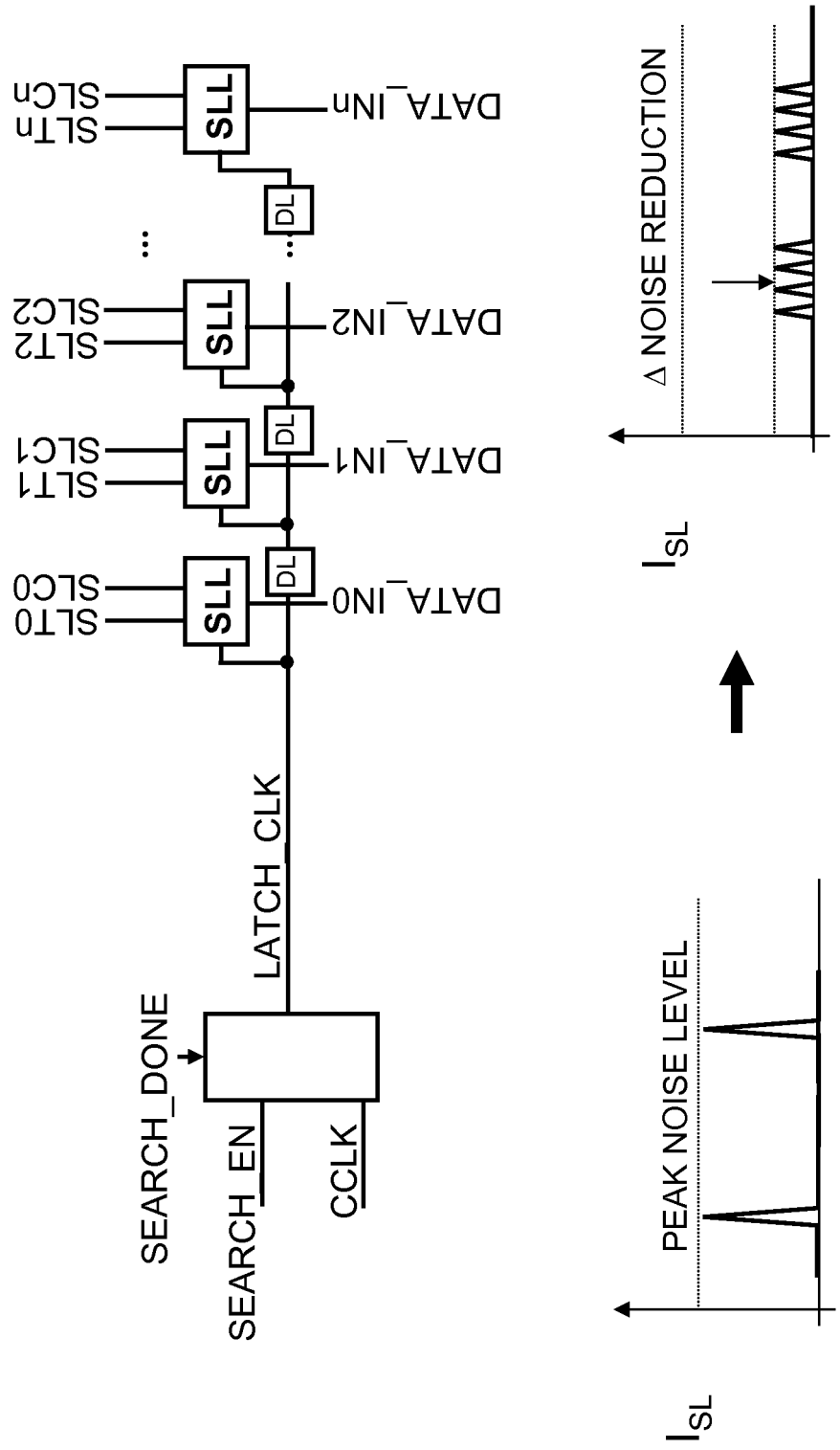
FIG. 7 illustrates an alternate embodiment of the asynchronous SL activation in accordance with the present invention.

FIG. 7 shows an alternative embodiment of the present invention. Here a delay block (DL) is added between the latch clock signal of successive SLL blocks. DL can be between successive SLLs or between a groups of SLLs. DL delays the SL activation of the corresponding SLL. This allows spreading of the current demand associated with SL switching over a larger portion of the cycle significantly reducing the magnitude of the power-supply noise associated with the SL switching. However it also increases the time required to switch all SLs which can reduce the operating frequency of the CAM. Alternatively DL can be programmed to generate no delay, more delay, or less delay e.g. at the best case process corner, DL can be increased to spread out SL switching more and reduce power-supply noise without causing any significant impact to the CAM operating frequency.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method of asynchronous search-line switching in a content addressable memory having a plurality of match-lines (ML) and a plurality of search-lines (SL), the method comprising:
   applying a search word to the plurality of search-lines;
   providing a reference match-line (RML) used to generate a timing sequence for a search operation based on an edge of a clock;
   performing a compare of the full search word with a corresponding word of each one of a plurality of addressable words, resulting in match or mismatch results for each addressable word to end the search operation; and
   allowing the next search word to propagate onto the search-lines at the end of the previous search operation prior to the next edge of the clock.

2. The method of claim 1 wherein the application of the search word on the search-lines is triggered by the completion of a previous memory operation.

3. The method of claim 2 wherein the search-line is triggered by the application of new search data on the search-lines is qualified with multiple search control signals.

4. The method of claim 1 wherein the content addressable memory is an embedded ternary content addressable memory.

5. The method of claim 1 wherein the application of the search word on the search-lines is staggered such that the data application of SLs is delayed to reduce peak current demand.

6. The method of claim 5 wherein the staggering of the application of the search word on the SLs is programmable to control delay time.

7. The method of claim 6 wherein the delay may be reduced to minimize SL delay in cycle-limited applications.

8. The method of claim 5 wherein the delay can be controlled by information on the processing parameters of the memory.

9. A content addressable memory integrated circuit having a plurality of match-lines (ML) and a plurality of search-lines (SL), the circuit comprising:
   a circuit to apply a search word to the plurality of search-lines to start a search operation;
   a reference match-line (RML) to generate a switching sequence for the search operation based on the edge of a clock,
   a compare circuit of the full search word with the corresponding word of each one of a plurality of addressable words, resulting in match or mismatch results for each addressable words to end the search operation prior to the next sequential edge of the clock; and
   a reset circuit to apply the next search word at the end of the previous search operation and prior to the next edge of the clock.

10. The circuit of claim 9 wherein the resetting of the match-lines is triggered by the completion of a previous memory operation.

11. The circuit of claim 10 wherein the signal triggering the application of new search data on the search-lines is qualified with multiple search control signals.

12. The circuit of claim 9 wherein the content addressable memory is an embedded ternary content addressable memory.

13. The circuit of claim 12 wherein the application of the search word on the search-lines is staggered such that the data application to the groups of SLs is delayed to reduce on-chip noise.

14. The circuit of clam 13 wherein the staggering of the application of data to the SLs is performed by a programmable delay circuit.

15. The circuit of claim 14 wherein the programmable delay can be reduced to minimize SL delay in cycle-limited applications.

16. The circuit of claim 13 wherein the programmable circuit is controlled by processing parameters externally provided.

* * * * *